(12) United States Patent
Kim

(10) Patent No.: US 8,039,856 B2
(45) Date of Patent: Oct. 18, 2011

(54) LIGHT EMITTING DIODE MODULE FOR LINE LIGHT SOURCE

(75) Inventor: Il Ku Kim, Gyunggi-do (KR)

(73) Assignee: Samsung LED Co., Ltd., Gyunggi-Do (KR)

(*) Notice: Subject to any disclaimer, the term of this patent is extended or adjusted under 35 U.S.C. 154(b) by 59 days.

(21) Appl. No.: 11/802,626

(22) Filed: May 24, 2007

(65) Prior Publication Data

US 2008/0017872 A1    Jan. 24, 2008

(30) Foreign Application Priority Data

Jul. 24, 2006   (KR) .................. 10-2006-0069262

(51) Int. Cl.
*H01L 29/22* (2006.01)
*H01L 33/00* (2006.01)

(52) U.S. Cl. .............. 257/98; 257/79; 257/E25.014; 257/E33.059; 362/297

(58) Field of Classification Search .......... 257/98, 257/79, E25.014, E33.059; 362/297
See application file for complete search history.

(56) References Cited

U.S. PATENT DOCUMENTS

| 5,813,753 | A | 9/1998 | Vriens et al. | |
| 2004/0227149 | A1 | 11/2004 | Ibbetson et al. | |
| 2005/0230691 | A1* | 10/2005 | Amiotti et al. | 257/79 |
| 2006/0180821 | A1* | 8/2006 | Fan et al. | 257/98 |
| 2007/0165417 | A1* | 7/2007 | Wu et al. | 362/555 |
| 2008/0048200 | A1* | 2/2008 | Mueller et al. | 257/98 |

FOREIGN PATENT DOCUMENTS

| EP | 1 657 758 A2 | 5/2006 |
| JP | 2000-173304 | 6/2000 |
| JP | 2000-277812 | 10/2000 |
| JP | 2006-190814 | 7/2006 |
| JP | 2006-190847 | 7/2006 |
| KR | 10-2005-0012372 | 2/2005 |
| KR | 10-2006-0052423 | 5/2006 |

OTHER PUBLICATIONS

German Office Action, with English translation, issued in German Patent Application No. DE 10 2007 021 042.8, mailed Feb. 13, 2009.
Japanese Office Action issued in Japanese Patent Application No. 2007-134276, mailed Nov. 17, 2009.
Korean Office Action, with English Translation, issued in Corresponding Korean Patent Application No. 10-2006-0069292, dated Aug. 29, 2007.

* cited by examiner

*Primary Examiner* — Cuong Q Nguyen
*Assistant Examiner* — Cathy N Lam
(74) *Attorney, Agent, or Firm* — McDermott Will Emery & Emery LLP

(57) ABSTRACT

A light emitting diode module for a line light source includes a circuit board having a wire pattern formed thereon and a plurality of LED chips directly mounted and disposed in a longitudinal direction on the circuit board and electrically connected to the wire pattern. The module also includes a reflecting wall installed on the circuit board to surround the plurality of LED chips, reflecting light from the LED chips. The module further includes a heat sink plate underlying the circuit board to radiate heat generated from the LED chip.

7 Claims, 5 Drawing Sheets

LIGHT EMITTING DIODE MODULE FOR LINE LIGHT SOURCE

CLAIM OF PRIORITY

This application claims the benefit of Korean Patent Application No. 2006-0069262 filed on Jul. 24, 2006, in the Korean Intellectual Property Office, the disclosure of which is incorporated herein by reference.

BACKGROUND OF THE INVENTION

1. Field of the Invention

The present invention relates to a Light Emitting Diode (LED) module for a line light source and, more particularly, to an LED module for a line light source, which increases light emission efficiency and maximizes heat radiation capacity.

2. Description of the Related Art

In general, LED chips are semiconductor devices made of compound materials such as GaAs, AlGaAs, InGaAs, GaN, InGaN, etc. and configured to emit various colors of beams. The LED chips are used in the form of packages, which can be used as light sources for planar displays using liquid crystal displays, etc.

FIG. 1 is a sectional view illustrating a conventional LED module.

Referring to FIG. 1, the conventional LED module 10 is fabricated in the form of a Surface Mount Device (SMD), and includes a Metal Core Printed Circuit Board (MCPCB) 12, a wire pattern 14 formed on the MCPCB, and an LED package 16 electrically connected to the wire pattern.

The MCPCB 12 supports the LED package 16 and controls the light emission of the LED package 16 with a circuit connected to the package.

The LED package 16 includes a package body 16a, an LED chip 16b mounted on the package body 16a, and a resin encapsulant 16c sealing the LED chip 16b. Here, the LED chip 16b is a point light source generating red, green or blue light, and the red, green and blue LED chips 16b can be combined to obtain white light from the LED module 10.

However, the LED module with the above structure is not effective in radiating heat from the LED chip due to the low heat radiation capacity of the MCPCB, and when the heat remains in the package without being radiated, light efficiency is degraded.

In addition, the LED package occupies a large space, hindering miniaturization, and the LED chip should be attached by a reflow process, which increases the costs.

FIG. 2a is a schematic view illustrating the LED module of FIG. 1 applied as a backlight unit, and FIG. 2b is a picture showing the light emission characteristics of the backlight unit.

In general, a beam angle of the LED package 16 used in the conventional LED module cannot be adjusted greater than maximum ±120°. Thus, as shown in FIGS. 2a and 2b, a dark spot 30 is formed in a portion of a light guide plate 20 where a relatively smaller amount of light reaches, and such a dark spot 30 degrades the uniformity of the luminance of the liquid crystal display.

Furthermore, the conventional LED module is not effective in preventing the loss of light emitted in lateral directions, further degrading the luminance.

SUMMARY OF THE INVENTION

The present invention has been made to solve the foregoing problems of the prior art and therefore an aspect of the present invention is to provide an LED module for a line light source, which can improve light emission efficiency and maximize heat radiation capacity.

Another aspect of the invention is to provide an LED module for a line light source, which effectively prevents loss of light emitted in lateral directions, thereby maximizing the luminance.

According to an aspect of the invention, the invention provides a LED module for a line light source. The LED module includes a circuit board with a wire pattern formed thereon; a plurality of light emitting diode chips directly mounted on the circuit board and electrically connected to the wire pattern, the light emitting diode chips disposed in a longitudinal direction of the circuit board; a reflecting wall installed on the circuit board to surround the plurality of light emitting diode chips, the reflecting wall for reflecting light from the plurality of light emitting diode chips; and a heat sink plate underlying the circuit board to radiate heat generated from the light emitting diode chips.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
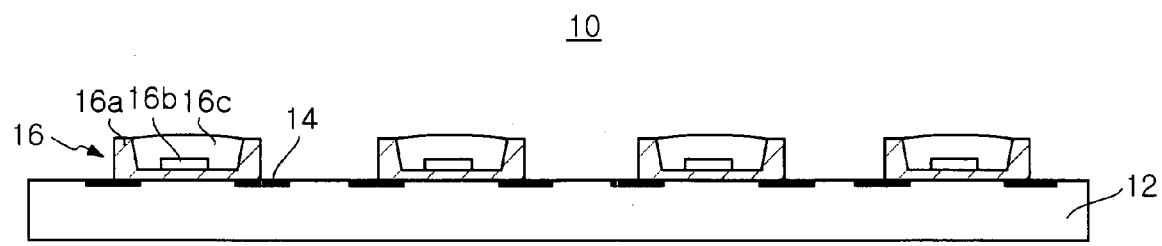
FIG. 1 is a sectional view illustrating a conventional LED module.
Figure 2A:
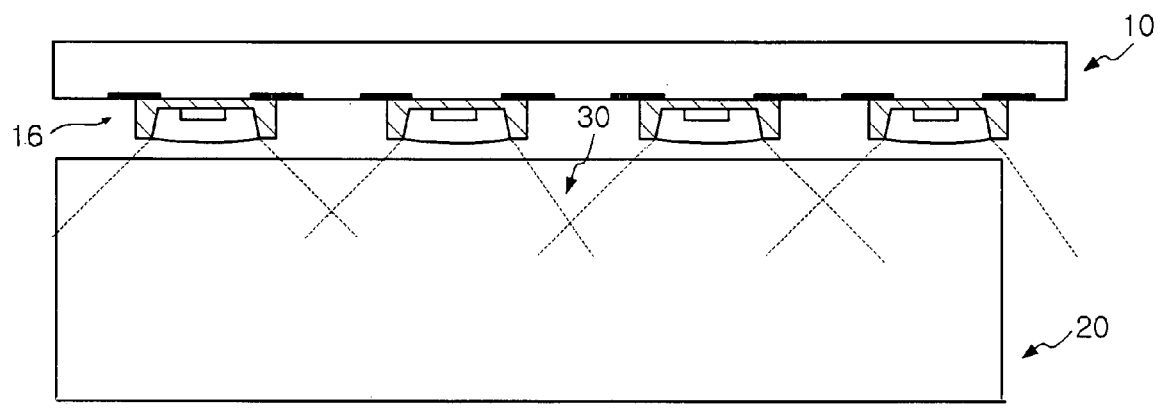
FIG. 2a is a schematic view illustrating the conventional LED module applied as a backlight unit.
Figure 2B:
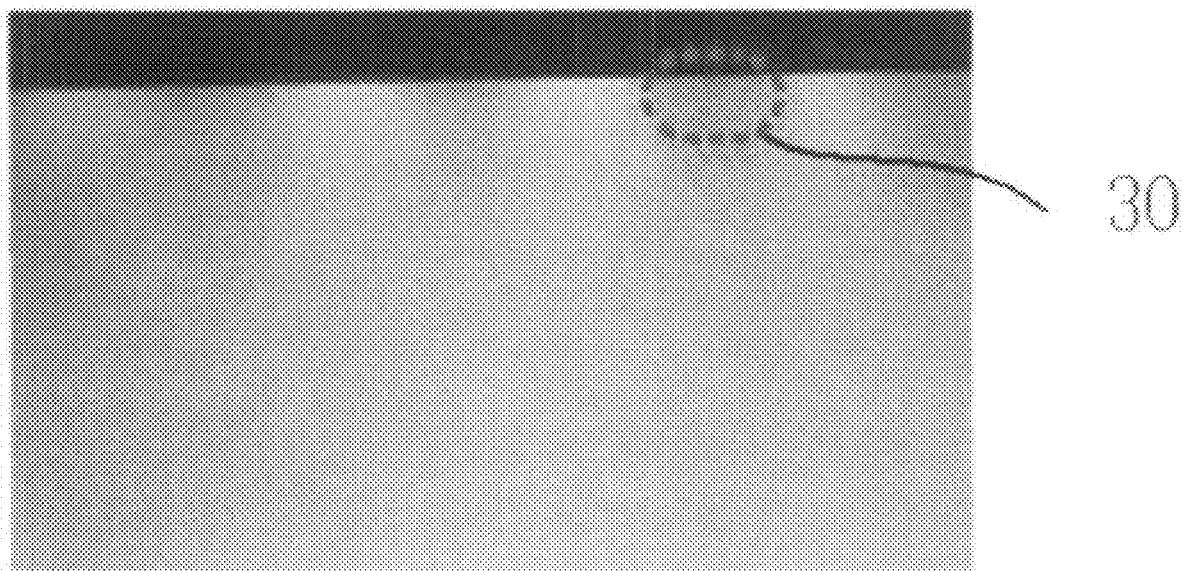
FIG. 2b is a picture showing the light emission characteristics of the backlight unit.
Figure 3:
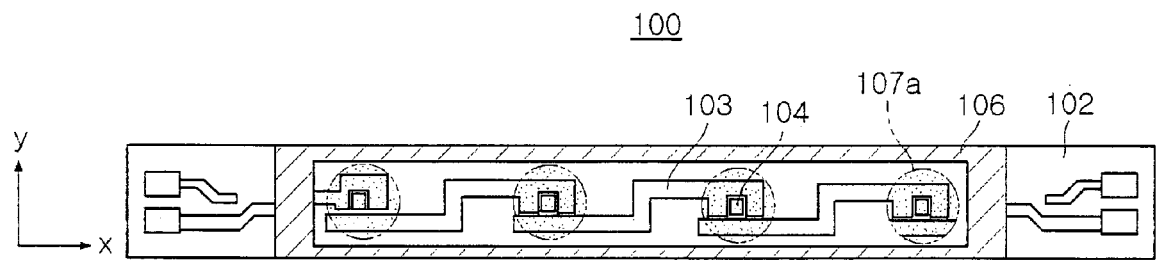
FIG. 3 is a plan view illustrating an LED module for a line light source according to an embodiment of the present invention.
Figure 4:
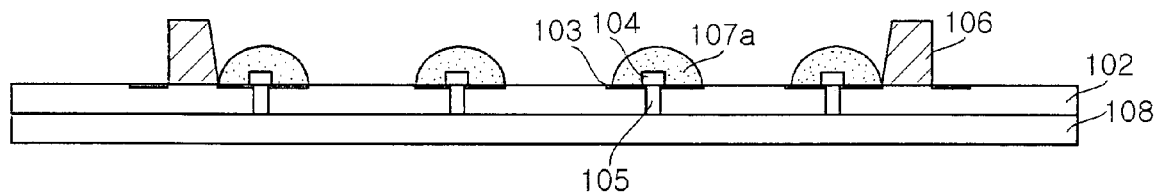
FIG. 4 is a sectional view illustrating the LED module for a line light source according to an embodiment of the present invention.

In the drawings, FIG. 3 is a plan view illustrating an LED module for a line light source according to an embodiment of the present invention, and FIG. 4 is a sectional view illustrating the LED module for a line light source according to an embodiment of the present invention.

As shown in FIGS. 3 and 4, the LED module 100 for a line light source according to the present invention includes a circuit board 102, a plurality of LED chips 104, a reflecting wall 106 and a heat sink plate 108.

On the circuit board 102, a wire pattern 103 is formed to supply power and electrical signals to the LED chip 104.

In addition, vias 105 are formed through the circuit board 102 to assist radiation of the heat from the LED chip 104 to the heat sink plate 108.

That is, the circuit board 102 has vias 105 formed therethrough to facilitate attachment of the heat sink plate 108 as well as to assist effective radiation of the heat generated from the LED chip 104 to the outside.

The plurality of LED chips 104 are mounted directly on the circuit board 102 and disposed in a longitudinal direction of the circuit board 102 so as to be electrically connected to the wire pattern 103, thereby forming a line light source.

For example, each of the LED chips 104 can be made of a material selected from the group consisting of GaN-based, GaAs-based, GaP-based, InGaN-based, InAlGaN-based, InGaP-based, and InGaAsP-based semiconductors, and can be any one of epitaxial-side-up (epi-up), flip bonding, and vertical types depending on the form and use thereof.

In the present invention, it is preferable that the circuit board 102 is a ceramic circuit board. This is because the ceramic circuit board is advantageous for forming the vias through patterning and deposition processes as compared to the existing MCPCB. In addition, the MCPCB requires welding between the metals to be attached to the heat sink plate described later due to its material characteristics, but the ceramic circuit board allows simple attachment to the heat sink plate with a glass-based adhesive.

The reflecting wall 106 is installed on the circuit board 102 to surround the plurality of LED chips 104, thereby reflecting light from the plurality of LED chips. At this time, a greater height of the reflecting wall 106 can increase the light extraction efficiency, but results in a large size of the LED module. Conversely, a lower height of the reflecting wall 106 decreases the size of the LED module but degrades the light extraction efficiency. Therefore, it is preferable that the reflecting wall 106 has an angle in the range of 0 to 180° so as to balance the beam angle and the light extraction efficiency.

In addition, the reflecting wall 106 is configured to have an appropriate height and a thickness so that the LED module can be used as a backlight unit. Preferably, the reflecting wall 106 assists in emission of light in a radiation pattern of about 180° from the LED chips 104 and through resin encapsulants 107a and 107b so that the LED module can optimally function as a line light source without any light loss.

In an embodiment, the reflecting wall 106 is made of a highly reflective metal layer with a light reflection ratio in a range of 90 to 99%. Such a highly reflective metal layer is made one metal selected from the group consisting of Ag, Al, Rh, Ni, Cu, W, Ti, and alloys thereof.

In another embodiment, the reflecting wall 106 can be made into a non-conductive wall structure (not shown) with a highly reflective metal layer coated on an inner side thereof adjacent to the LED chips 104 via electrolyte and non-electrolyte plating. The non-conductive wall structure is made of, for example, a polymer material or a ceramic material, which has low reflectivity and is inexpensive. At this time, if the non-conductive wall structure is made of the ceramic material, it can be integrally formed with the circuit board 102. That is, in a case where the circuit board 102 is a ceramic circuit board in an embodiment of the present invention, the non-conductive wall structure can be subjected to plastic working together with the circuit board 102 and then coated with the highly reflective metal layer on an outer surface thereof.

In the present invention, the reflecting wall 106 has an advantage of preventing the loss of light emitted in lateral directions. That is, referring to the plan view of FIG. 3, the reflecting wall 106 at the opposed peripheral parts of the circuit board focuses the light deviating in the X-axis direction to a desired emission direction and the light deviating out of the Y-axis direction from the circuit board to an upward direction to prevent light loss, thereby maximizing the luminance as compared to the conventional LED module.

The heat sink plate 108 is formed underneath the circuit board 102 to radiate the heat generated from the LED chips 104 to the outside. In particular, the heat sink plate 108 enhances the heat radiation capacity of the LED module together with the vias 105 formed in the circuit 102.

That is, the heat sink plate 108 transfers the heat generated from the LED chips 104 on the circuit board 102 to the lower end thereof to assist radiation of the heat to the outside.

The heat sink plate 108 can be made of the same material as the reflecting wall 106, and of course, can also be made of a combination of two different materials for effective heat radiation.

Preferably, the heat sink plate can be made of one selected from Al, Ni, Cu, W, Ti, and alloys of at least two thereof.

Each of the LED chips 104 is sealed by a resin encapsulant 107a having an upper hemispheric shape, and the resin encapsulant 107a can allow the light from the LED chips 104 to be emitted uniformly in all directions.

Figure 5:
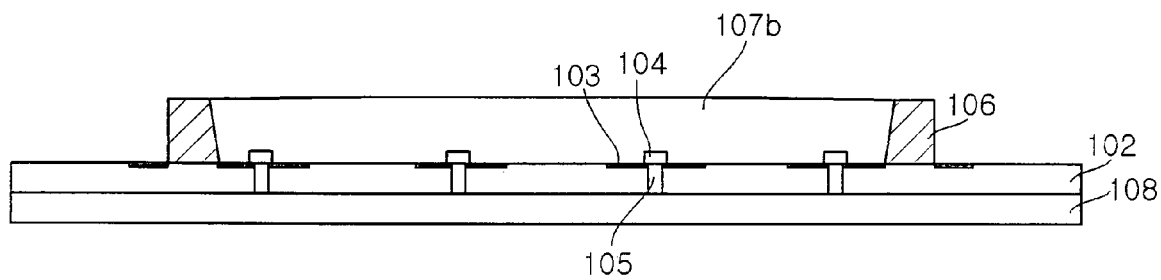
FIGS. 5 and 6 are sectional views illustrating an LED module according to another embodiment of the present invention.
Figure 6:
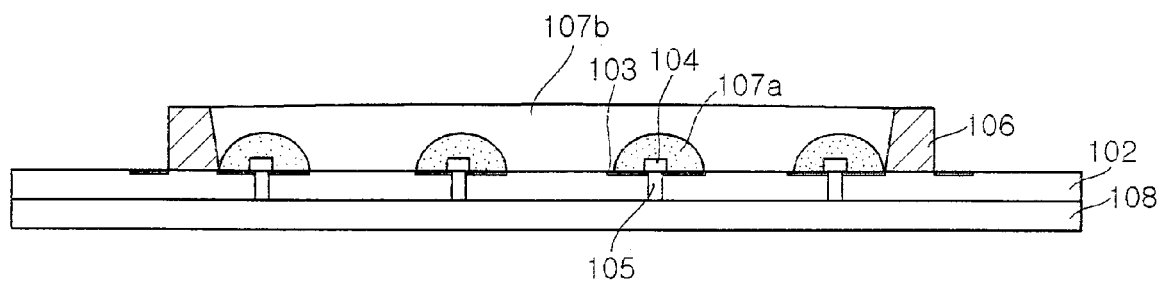

FIGS. 5 and 6 are sectional views illustrating a resin encapsulant according to other embodiments of the present invention.

The resin encapsulant 107b of FIG. 5 is configured to seal all of the LED chips 104 together.

On the other hand, the resin encapsulant 107a and 107b of FIG. 6 is composed of dual layers, which includes a first resin encapsulant 107a having an upper hemispheric shape, and a second resin encapsulant 107b sealing the first resin encapsulant 107a. At this time, it is preferable that the first resin encapsulant 107a has a refractive index n1 greater than a refractive index n2 of the second resin encapsulant 107b (n1>n2). That is, the refractive index difference between the LED chips and the outside air is mitigated in a stepwise fashion through the first resin encapsulant 107a and the second resin encapsulant 107b.

The resin encapsulant according to the present invention can be formed by dispensing a transparent resin with phosphor having particular color coordinates mixed therein. For example, the light emitted from a blue chip can be converted to white light through the mixture of the phosphor and the silicone resin. That is, the type and the amount of the phosphor mixed in the resin encapsulant can be adjusted to fabricate an LED chip emitting light having a desired wavelength or combined wavelengths.

In the present invention, white light output can be obtained by combinations of blue, red and green LED chips, of a blue chip and yellow phosphor, of an UV LED chip and red, green and blue phosphors, and of blue and red LED chips and green phosphor.

Preferably according to the present invention, the blue LED chip has a peak wavelength of 430 to 480 nm, the green LED chip has a peak wavelength of 510 to 550 nm, and the red LED chip has a peak wavelength of 610 to 700 nm.

In addition, preferably according to the present invention, the green phosphor has an excited wavelength of 200 to 500 nm and a peak wavelength of 500 to 570 nm, the red phosphor has a peak wavelength of 610 to 700 nm, and the blue phosphor has a peak wavelength of 200 to 500 nm.

According to an exemplary embodiment, in order to obtain high quality white light with improved color reproducibility, the LED chip according to the present invention has a peak wavelength of 370 nm to 470 nm, and the phosphor is excited by the LED chip to emit light in a triangular region defined by color coordinates (0.556056, 0.44084), (0.625335, 0.37419) and (0.734641, 0.26536).

For reference, the light emitted from the resin encapsulant according to the present invention has a beam angle in a range of 10 to 180°.

Figure 7A:
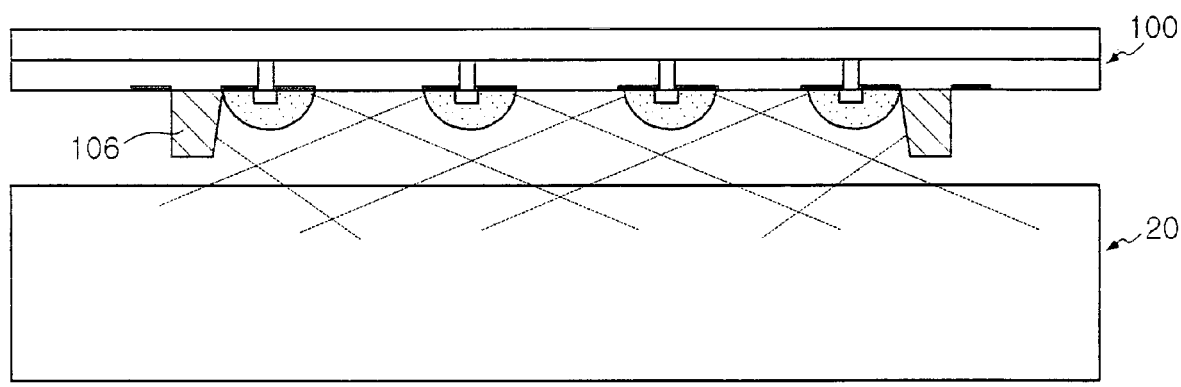
FIG. 7a is a schematic view illustrating the LED module for a line light source according to the present invention applied as a backlight unit.
Figure 7B:
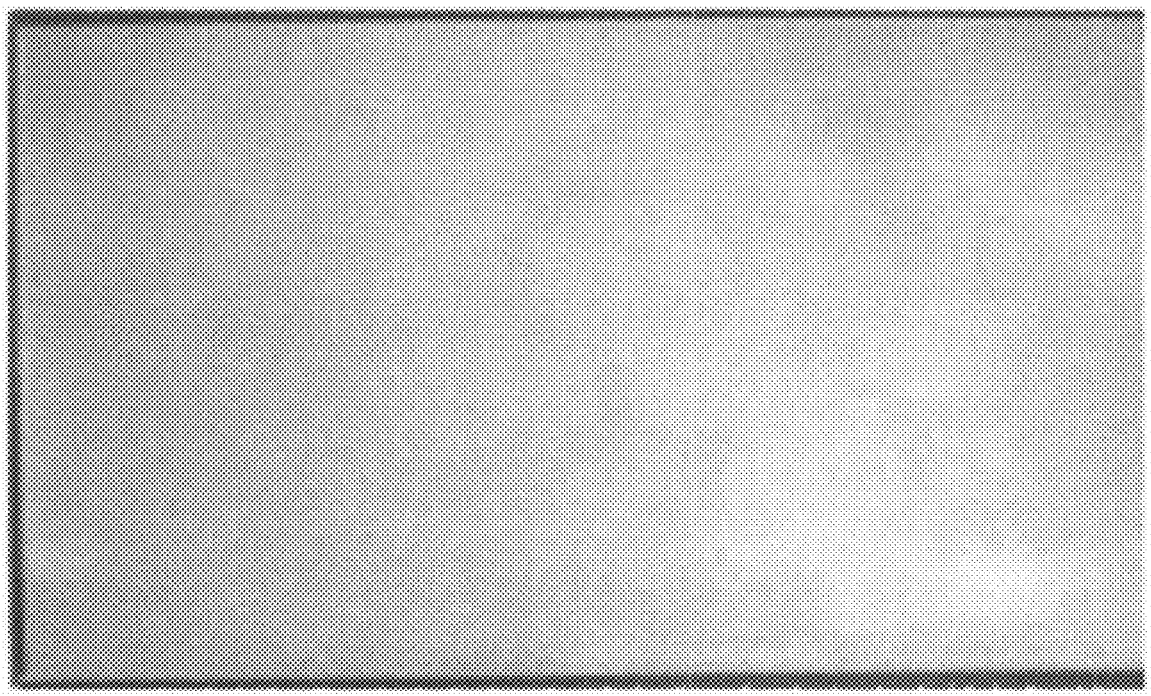
FIG. 7b is a picture showing the light emission characteristics of the backlight unit.

FIG. 7a is a conceptual view illustrating the LED module for a line light source according to the present invention applied as a backlight unit, and FIG. 7b is a picture showing the light emission characteristics of the backlight unit.

The LED module for a line light source according to the present invention preferably can be applied as an edge type backlight unit having at least one light source at a side of a light guide panel.

As shown in FIGS. 7a and 7b, the LED chips 104 are directly mounted on a circuit board via chip-on-board method without separate LED packages, which allows adjusting the beam angle up to nearly 180°. Also, the reflecting wall 106 effectively prevents the loss of light deviating in lateral directions (Y-axis direction), and allows emission of light in a radiation pattern of about 180°, thereby solving the conventional problem of dark spots formed in the light guide panel 20. Therefore, according to the exemplary embodiments of the present invention, the factors for degradation of the luminance of the liquid crystal display can be fundamentally eliminated.

According to the present invention as set forth above, LED chips are directly mounted on a circuit board without separate LED packages, thereby significantly increasing a beam angle. In addition, the light emitted in lateral directions can be effectively reflected in a desired emission direction, that is, the linearity of light in one direction is enhanced, thereby improving the luminance of an LED module applied as a backlight unit.

Therefore, a sufficient level of luminance can be achieved with a fewer number of LED chips than the conventional LED package, and in particular, the heat generated from the LED chips is radiated to a heat sink plate underlying the circuit board, thereby assuring high reliability.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode module for a line light source, comprising:

a circuit board with a wire pattern formed thereon;

a plurality of light emitting diode chips directly mounted on the circuit board and electrically connected to the wire pattern, the light emitting diode chips disposed in a longitudinal direction of the circuit board to form the line light source;

a reflecting wall disposed on an upper surface of the circuit board in direct contact with the upper surface of the circuit board to completely surround an outline of the line light source comprising the plurality of light emitting diode chips, the reflecting wall for reflecting light from the plurality of light emitting diode chips in the line light source; and a heat sink plate underlying the circuit board to radiate heat generated from the light emitting diode chips, wherein the circuit board comprises a ceramic circuit board, and vias perforated through the circuit board under the light emitting diode chips, respectively, to assist radiation of heat generated from the light emitting diode chips to the heat sink plate, the reflecting wall comprises a non-conductive wall structure having a highly reflective metal layer coated on an inner side thereof adjacent to the light emitting diode chips, and the non-conductive wall structure comprises a ceramic material that is integral with the circuit board.

2. The light emitting diode module according to claim 1, wherein each of the light emitting diode chips comprises a material selected from the group consisting of GaN-based, GaAs-based, GaP-based, InGaN-based, InAlGaN-based, InGaP-based, and InGaAsP-based semiconductors.

3. The light emitting diode module according to claim 1, wherein the highly reflective metal layer comprises at least one selected from the group consisting of Ag, Al, Rh, Ni, Cu, W, Ti and alloys thereof.

4. The light emitting diode module according to claim 1, wherein the heat sink plate comprises one selected from the group consisting of Al, Ni, Cu, W, Ti, and alloys of at least two thereof.

5. The light emitting diode module according to claim 1, further comprising a resin encapsulant with a hemispheric upper surface for sealing each of the light emitting diode chips.

6. The light emitting diode module according to claim 1, wherein the light emitting diode chips comprise a combination of blue, red and green light emitting diode chips.

7. The light emitting diode module according to claim 1, wherein the light emitting diode module is used as a light source for an edge type back light unit.

* * * * *